United States Patent
Kaneda et al.

(10) Patent No.: US 10,097,158 B2
(45) Date of Patent: Oct. 9, 2018

(54) ACOUSTIC WAVE DEVICE, FILTER, AND DUPLEXER

(71) Applicant: TAIYO YUDEN CO., LTD., Tokyo (JP)

(72) Inventors: Yasufumi Kaneda, Tokyo (JP); Takuma Kuroyanagi, Tokyo (JP); Hitoshi Tsukidate, Tokyo (JP); Osamu Ikata, Tokyo (JP); Kaoru Sakinada, Tokyo (JP); Michio Miura, Tokyo (JP); Tooru Takezaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 62 days.

(21) Appl. No.: 14/861,938

(22) Filed: Sep. 22, 2015

(65) Prior Publication Data
US 2016/0112030 A1 Apr. 21, 2016

(30) Foreign Application Priority Data

Oct. 16, 2014 (JP) .................................. 2014-211899
Jul. 7, 2015 (JP) .................................. 2015-136546

(51) Int. Cl.
*H03H 9/145* (2006.01)
*H03H 9/25* (2006.01)
(Continued)

(52) U.S. Cl.
CPC ...... *H03H 9/14591* (2013.01); *H03H 9/1455* (2013.01); *H03H 9/25* (2013.01);
(Continued)

(58) Field of Classification Search
CPC .. H03H 9/145; H03H 9/1455; H03H 9/14591; H03H 9/14597; H03H 9/25;
(Continued)

(56) References Cited

U.S. PATENT DOCUMENTS 3,600,710 A * 8/1971 Adler ................. H03H 9/14597
257/416
4,166,258 A * 8/1979 Tseng .................... H03H 9/027
310/313 D
(Continued)

FOREIGN PATENT DOCUMENTS

| CN | 1441552 A | 9/2003 |
| CN | 102204092 A | 9/2011 |

(Continued)

OTHER PUBLICATIONS

English language machine translation of JP 10-173470, published Jun. 26, 1998, 3 pages.*

(Continued)

*Primary Examiner* — Barbara Summons
(74) *Attorney, Agent, or Firm* — Chen Yoshimura LLP

(57) ABSTRACT

Acoustic wave device includes: a piezoelectric substrate; a first IDT located on the piezoelectric substrate; and a second IDT located on the piezoelectric substrate and connected in series to the first IDT, wherein the first IDT and the second IDT share a single common bus bar as a first bus bar of two bus bars of the first IDT and a first bus bar of two bus bars of the second IDT, and the common bus bar has a width not more than two times a wavelength of an acoustic wave propagating through the first and second IDTs, the common bus bar connects to no dummy electrode finger facing a tip of an electrode finger connected to a second bus bar of the two bus bars of the first IDT and the second IDT across a gap.

14 Claims, 16 Drawing Sheets

(51) Int. Cl.
*H03H 9/64* (2006.01)
*H03H 9/72* (2006.01)

(52) U.S. Cl.
CPC ........ *H03H 9/6443* (2013.01); *H03H 9/6483* (2013.01); *H03H 9/725* (2013.01)

(58) Field of Classification Search
CPC ...... H03H 9/64; H03H 9/6426; H03H 9/6433; H03H 9/6443; H03H 9/6456; H03H 9/6463; H03H 9/725; H03H 9/6483
USPC ........................ 333/133, 193–196; 310/313 B
See application file for complete search history.

(56) References Cited

U.S. PATENT DOCUMENTS

| | | | | |
|---|---|---|---|---|
| 4,425,554 A | * | 1/1984 | Morishita | H03H 9/14591 |
| | | | | 310/313 D |
| 4,542,356 A | * | 9/1985 | Nakazawa | H03H 9/02944 |
| | | | | 310/313 D |
| 5,077,545 A | * | 12/1991 | Gopani | H03H 9/6409 |
| | | | | 310/313 D |
| 5,877,662 A | * | 3/1999 | Kobayashi | H03H 9/0274 |
| | | | | 310/313 D |
| 5,912,602 A | * | 6/1999 | Takagi | H03H 9/02834 |
| | | | | 310/313 D |
| 6,121,860 A | | 9/2000 | Tsutsumi et al. | |
| 6,150,900 A | | 11/2000 | Kadota et al. | |
| 6,353,371 B1 | * | 3/2002 | Kadota | H03H 9/02669 |
| | | | | 310/313 B |
| 6,353,372 B1 | * | 3/2002 | Baier | H03H 9/0028 |
| | | | | 310/313 C |
| 7,170,372 B2 | | 1/2007 | Ruile | H03H 9/02992 |
| | | | | 310/313 C |
| 7,212,086 B2 | * | 5/2007 | Nishizawa | H03H 9/0028 |
| | | | | 333/193 |
| 7,425,878 B2 | * | 9/2008 | Inoue | H03H 9/0038 |
| | | | | 310/313 D |
| 2002/0140519 A1 | | 10/2002 | Takayama et al. | |
| 2003/0117240 A1 | | 6/2003 | Inoue et al. | |
| 2003/0164745 A1 | | 9/2003 | Takamine | |
| 2011/0193655 A1 | | 8/2011 | Kamiguchi et al. | |
| 2016/0336919 A1 | | 11/2016 | Taniguchi | |

FOREIGN PATENT DOCUMENTS

| | | | |
|---|---|---|---|
| DE | 100 57 848 A1 | * | 5/2002 |
| JP | 64-054805 | * | 3/1989 |
| JP | 5-129884 A | | 5/1993 |
| JP | 6-37585 A | | 2/1994 |
| JP | 07-074584 A | * | 3/1995 |
| JP | 08-213876 | * | 8/1996 |
| JP | 10-32463 A | | 2/1998 |
| JP | 10-173470 | * | 6/1998 |
| JP | 11-017493 A | | 1/1999 |
| JP | 2000-323935 A | | 11/2000 |
| JP | 2001-24471 A | | 1/2001 |
| JP | 2001-024471 A | * | 1/2001 |
| JP | 2001-127587 A | | 5/2001 |
| JP | 2001-285025 A | | 10/2001 |
| JP | 2001-292050 | * | 10/2001 |
| JP | 2003-198317 A | | 7/2003 |
| JP | 2011-097237 A | | 5/2011 |
| KR | 10-1999-0088150 A | | 12/1999 |
| WO | 2015/119025 A1 | | 8/2015 |

OTHER PUBLICATIONS

English language machine translation of JP 08-213876, published Aug. 20, 1996, 3 pages.*
English language machine translaton of JP 64-054805, published Mar. 2, 1989, 4 pages.*
English language machine translation of JP 2001-292050, published Oct. 19, 2001, 7 pages.*
English language machine translation of DE 100 57 848 A1, published May 23, 2002, 7 total pages.*
Korean Office Action dated Jul. 26, 2016, in a counterpart Korean patent application No. 10-2015-0143064.
Chinese Office Action dated Aug. 30, 2017, in a counterpart Chinese patent application No. 201510651347.7.
Japanese Office Action dated Feb. 6, 2018, in a counterpart Japanese patent application No. 2015-136546. (A machine translation (not reviewed for accuracy) attached.).

* cited by examiner

Comparative Example

— FOURTH VARIATION OF FIRST EMBODIMENT
--- FIRST EMBODIMENT

— FOURTH VARIATION OF FIRST EMBODIMENT
--- FIRST EMBODIMENT

ACOUSTIC WAVE DEVICE, FILTER, AND DUPLEXER

CROSS-REFERENCE TO RELATED APPLICATION

This application is based upon and claims the benefit of priority of the prior Japanese Patent Application No. 2014-211899, filed on Oct. 16, 2014, and the prior Japanese Patent Application No. 2015-136546, filed on Jul. 7, 2015, the entire contents of which are incorporated herein by reference.

FIELD

A certain aspect of the present invention relates to an acoustic wave device, a filter, and a duplexer.

BACKGROUND

Acoustic wave devices are employed in filters and duplexers for wireless communication devices such as mobile phone terminals. There has been known surface acoustic wave (SAW) devices including an Interdigital Transducer (IDT) having a pair of comb-shaped electrodes located on a piezoelectric substrate as the acoustic wave device. Additionally, to improve power durability, there has been known serially dividing a single SAW device as disclosed in Japanese Patent Application Publication Nos. 2001-285025 and 2001-24471. Additionally, to improve the confinement of the surface acoustic wave in the resonator, there has been known providing dummy electrode fingers between electrode fingers in each of the comb-shaped electrodes as disclosed in Japanese Patent Application Publication No. 2003-198317. Alternatively, there has been known a multimode type surface acoustic wave device using waves in different modes, or connecting the multimode type surface acoustic wave devices in multiple stages as disclosed in Patent Application Publication Nos. 5-129884, 6-37585, 10-32463, 2000-323935, and 2001-127587.

When a single acoustic wave device is serially divided to improve power durability, the device increases in size.

SUMMARY OF THE INVENTION

According to an aspect of the present invention, there is provided an acoustic wave device including: a piezoelectric substrate; a first IDT located on the piezoelectric substrate and including electrode fingers and two bus bars; and a second IDT located on the piezoelectric substrate, including electrode fingers and two bus bars, and connected in series to the first IDT, wherein the first IDT and the second IDT share a single common bus bar as a first bus bar of the two bus bars of the first IDT and a first bus bar of the two bus bars of the second IDT, the common bus bar has a width that is not more than two times a wavelength of an acoustic wave propagating through the first IDT and the second IDT, and the common bus bar connects to no dummy electrode finger facing a tip of the electrode finger connected to a second bus bar of the two bus bars of the first IDT across a gap and no dummy electrode finger facing a tip of the electrode finger connected to a second bus bar of the two bus bars of the second IDT across a gap.

According to another aspect of the present invention, there is provided a filter including: the above acoustic wave device.

According to another aspect of the present invention, there is provided a duplexer including: the above filter.

DETAILED DESCRIPTION

Hereinafter, a description will be given of embodiments of the present invention with reference to the attached drawings.

First Embodiment

Figure 1A:
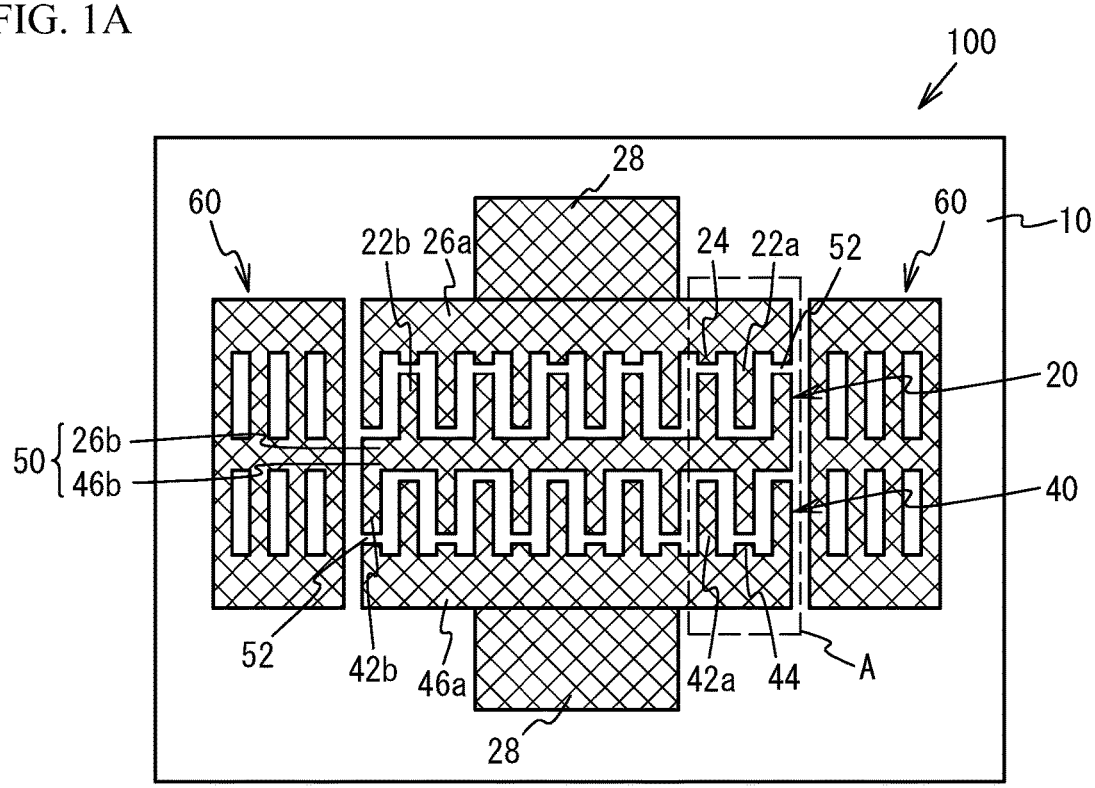
FIG. 1A is a top view of a SAW device in accordance with a first embodiment.
Figure 1B:
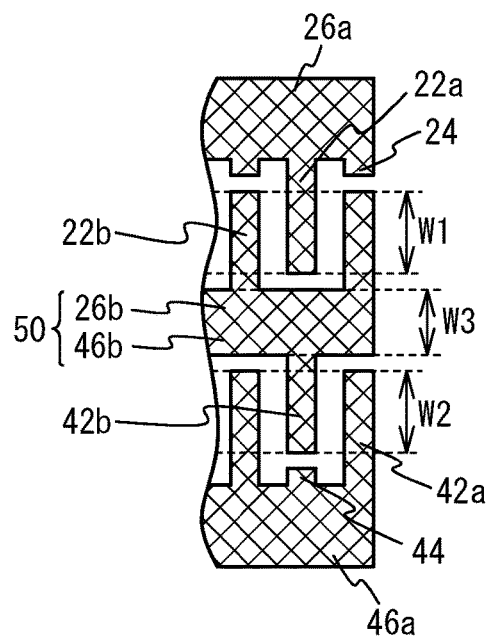
FIG. 1B is an enlarged view of a region A in FIG. 1A.

FIG. 1A is a top view of a SAW device in accordance with a first embodiment, and FIG. 1B is an enlarged view of a region A in FIG. 1A. A SAW device 100 of the first embodiment includes, as illustrated in FIG. 1A and FIG. 1B, a first IDT 20, a second IDT 40 connected in series to the first IDT 20, and reflectors 60 located at both sides of the first IDT 20 and the second IDT 40 in the propagation direction of the surface acoustic wave on a piezoelectric substrate 10. The piezoelectric substrate 10 is made of, for example, a piezoelectric material such as lithium niobate (LiNbO$_3$) or lithium tantalate (LiTaO$_3$). The first IDT 20, the second IDT 40, and the reflectors 60 may be made of, for example, a single layer metal film such as aluminum (Al) or copper (Cu), or an alloy mainly composed of Al. Alternatively, the first IDT 20, the second IDT 40, and the reflectors 60 may be made of a multilayered metal film including a metal such as titanium (Ti) or chrome (Cr) located under a single metal film such as Al or Cu or under an alloy mainly composed of Al.

The first IDT 20 includes a pair of comb-shaped electrodes. A first comb-shaped electrode of the comb-shaped electrodes includes electrode fingers 22a, dummy electrode fingers 24, and a bus bar 26a connecting to the electrode fingers 22a and the dummy electrode fingers 24. The electrode fingers 22a and the dummy electrode fingers 24 are alternately located, for example. The bus bar 26a connects to an input/output terminal 28. A second comb-shaped electrode of the comb-shaped electrodes includes electrode fingers 22b and a bus bar 26b connecting to the electrode fingers 22b. The electrode finger 22b is located so that the tip of the electrode finger 22b faces the tip of the dummy electrode finger 24 across a gap 52. On the other hand, the bus bar 26b connects to no dummy electrode finger between the electrode fingers 22b. Accordingly, the electrode finger 22a is located so that the tip of the electrode finger 22a faces the bus bar 26b across the gap 52.

In the same manner, the second IDT 40 includes a pair of comb-shaped electrodes. A first comb-shaped electrode of the comb-shaped electrodes includes electrode fingers 42a, dummy electrode fingers 44, and a bus bar 46a connecting to the electrode fingers 42a and the dummy electrode fingers 44. The electrode fingers 42a and the dummy electrode fingers 44 are alternately located, for example. The bus bar 46a connects to the input/output terminal 28. A second comb-shaped electrode of the comb-shaped electrodes includes electrode fingers 42b and a bus bar 46b connecting to the electrode fingers 42b. The electrode finger 42b is located so that the tip of the electrode finger 42b faces the tip of the dummy electrode finger 44 across the gap 52. On the other hand, the bus bar 46b connects to no dummy electrode finger between the electrode fingers 42b. Accordingly, the electrode finger 42a is located so that the tip of the electrode finger 42a faces the bus bar 46b across the gap 52.

The first IDT 20 and the second IDT 40 share a single common bus bar 50 as the bus bar 26b, which is one of the two bus bars of the first IDT 20, and the bus bar 46b, which is one of the two bus bars of the second IDT 40. The common bus bar 50 is a floating electrode.

The pitch of the electrode fingers 22a, 22b of the first IDT 20 is the same as the pitch of the electrode fingers 42a, 42b of the second IDT 40. The line and space ratio (hereinafter, referred to as an L/S ratio) of the first IDT 20, which is a ratio of the width of the electrode fingers 22a, 22b to the distance between the adjacent electrode fingers 22a, 22b, is the same as the L/S ratio of the second IDT 40, which is a ratio of the width of the electrode fingers 42a, 42b to the distance between the adjacent electrode fingers 42a, 42b. An aperture length W1, which is a width along which the electrode fingers 22a, 22b of the first IDT 20 overlap each other, is equal to an aperture length W2, which is a width along which the electrode fingers 42a, 42b of the second IDT 40 overlap each other.

As the pitch of the electrode fingers 22a, 22b of the first IDT 20 is the same as the pitch of the electrode fingers 42a, 42b of the second IDT 40, the wavelength of the surface acoustic wave propagating through the first IDT 20 is the same as the wavelength of the surface acoustic wave propagating through the second IDT 40.

The common bus bar 50 has a width W3 of, for example, 2.0 μm, where the width W3 is a width in the direction in which the electrode fingers 22a, 22b of the first IDT 20 and the electrode fingers 42a, 42b of the second IDT 40 extend. In the SAW device 100 of the first embodiment, the surface acoustic wave propagating through the first IDT 20 and the second IDT 40 has a frequency of, for example, 2.5 G Hz, and thus the width W3 is, for example, approximately 1.3λ, where λ is the wavelength of the surface acoustic wave propagating through the first IDT 20 and the second IDT 40. The reason why the width W3 is made to be 2.0λ or less will be described later.

Figure 2:
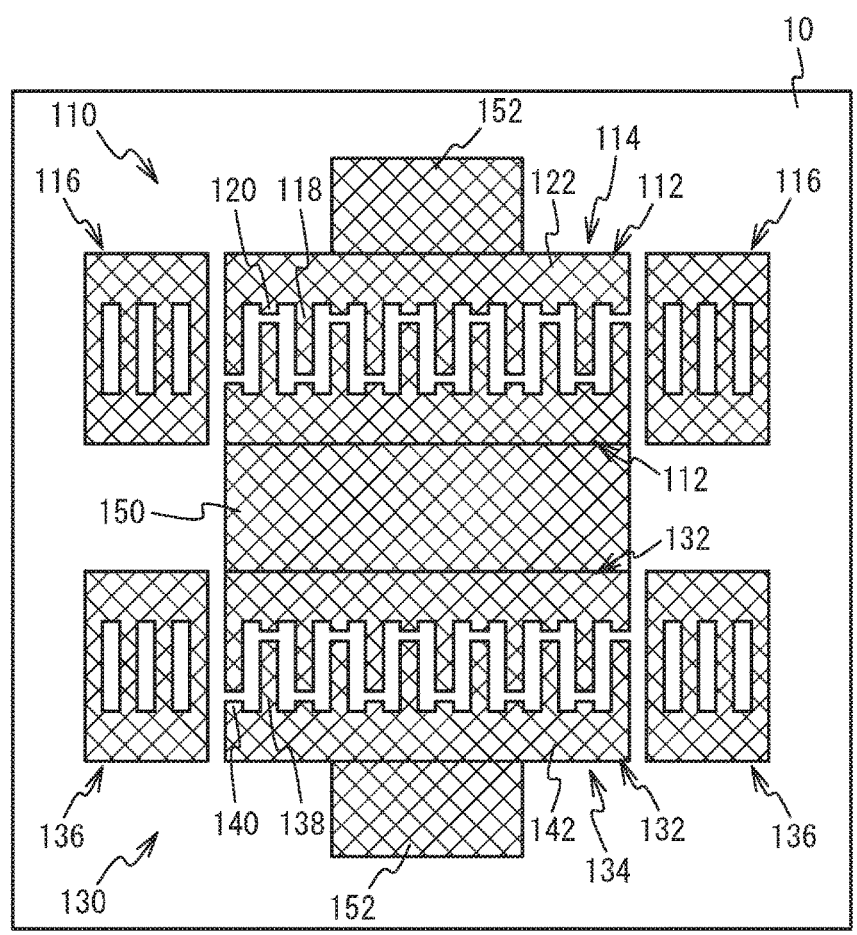
FIG. 2 is a top view of a SAW device in accordance with a first comparative example.

Here, a description will be given of a SAW device in accordance with a first comparative example to explain the advantages of the SAW device 100 of the first embodiment. FIG. 2 is a top view of a SAW device of the first comparative example. The SAW device of the first comparative example has a structure where one resonator is divided into two resonators 110, 130 and the resonators 110, 130 are connected in series by a wiring line 150 as illustrated in FIG. 2. The reason why one resonator is divided into two resonators 110, 130 and the resonators 110, 130 are connected in series is for improving the power durability, as described above.

The resonator 110 includes an IDT 114 including a pair of comb-shaped electrodes 112 and reflectors 116 located at both sides of the IDT 114 in the propagation direction of the surface acoustic wave. Each of the comb-shaped electrodes 112 includes electrode fingers 118, dummy electrode fingers 120, and a bus bar 122 connecting to the electrode fingers 118 and the dummy electrode fingers 120.

In the same manner, the resonator 130 includes an IDT 134 including a pair of comb-shaped electrodes 132 and reflectors 136 located at both sides of the IDT 134 in the propagation direction of the surface acoustic wave. Each of the comb-shaped electrodes 132 includes electrode fingers 138, dummy electrode fingers 140, and a bus bar 142 connecting to the electrode fingers 138 and the dummy electrode fingers 140.

A bus bar, which is not connected to the wiring line 150, of the bus bars 122 of the resonator 110 connects to an input/output terminal 152, and a bus bar, which is not connected to the wiring line 150, of the bus bars 142 of the resonator 130 connects to the input/output terminal 152.

When a single resonator is divided into two resonators 110, 130 and the resonators 110, 130 are connected in series by the wiring line 150 as described in the first comparative example, the device increases in size. Additionally, when dummy electrode fingers are located to prevent the surface acoustic wave from leaking to the outside of the resonator, the dummy electrode fingers 120 are located in each of the comb-shaped electrodes 112 of the resonator 110 and the dummy electrode fingers 140 are located in each of the comb-shaped electrode 132 of the resonator 130. This also increases the size of the device.

In contrast, the SAW device 100 of the first embodiment has, as illustrated in FIG. 1A and FIG. 1B, a structure where the first IDT 20 and the second IDT 40 are connected in series and share the single common bus bar 50 as the bus bar 26b, which is one of the two bus bars of the first IDT 20, and the bus bar 46b, which is one of the two bus bars of the second IDT 40. Thus, the power durability is improved and the size of the device is reduced. Additionally, the common bus bar 50 connects to no dummy electrode finger that faces the tip of the electrode finger 22a connected to the bus bar 26a, which is the other of the two bus bars of the first IDT 20, and no dummy electrode finger that faces the tip of the electrode finger 42a connected to the bus bar 46a, which is the other of the two bus bars of the second IDT 40. This structure also reduces the size of the device. When the common bus bar 50 connects to no dummy electrode finger, the surface acoustic wave propagating through the first IDT 20 propagates through the second IDT 40 with little loss even when the surface acoustic wave propagating through the first IDT 20 leaks to the second IDT 40 side by making the width W3 of the common bus bar 50 not more than two times the wavelength of the surface acoustic wave propagating through the first IDT 20 and the second IDT 40. This is also applicable to the case where the surface acoustic wave propagating through the second IDT 40 leaks to the first IDT 20 side. Accordingly, the first embodiment improves the power durability and reduces the size of the device with reducing the deterioration of the characteristics.

To allow the surface acoustic wave propagating through one of the first IDT 20 and the second IDT 40 to propagate through the other with little loss, the width W3 of the common bus bar 50 is preferably not more than 1.5 times the wavelength of the surface acoustic wave propagating through the first IDT 20 and the second IDT 40, and more preferably not more than 1.2 times. On the other hand, when the width W3 of the common bus bar 50 becomes too thin, the electric resistance increases. Thus, the width W3, is preferably more than 0.3 times the wavelength of the surface acoustic wave propagating through the first IDT 20 and the second IDT 40, and further preferably more than 0.5 times.

Additionally, in the SAW device 100 of the first embodiment, the bus bar 26a, which is not the common bus bar 50, of the two bus bars of the first IDT 20 connects to the dummy electrode fingers 24 located to face the tips of the electrode fingers 22b connected to the common bus bar 50 across the gaps 52 and the bus bar 46a, which is not the common bus bar 50, of the two bus bars of the second IDT 40 connects to the dummy electrode fingers 44 located to face the tips of the electrode fingers 42b connected to the common bus bar 50 across the gaps 52. This structure improves the confinement of the surface acoustic wave propagating through the first IDT 20 and the second IDT 40 in the device.

Figure 3:
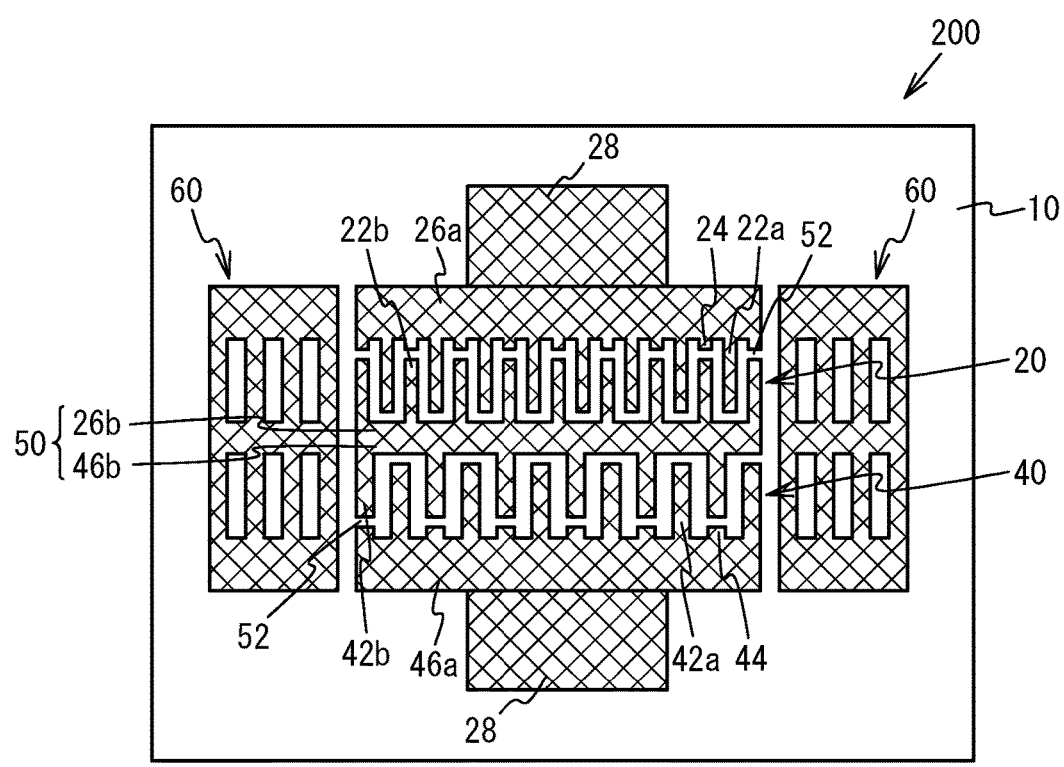
FIG. 3 is a top view of a SAW device in accordance with a first variation of the first embodiment.

FIG. 3 is a top view of a SAW device in accordance with a first variation of the first embodiment. A SAW device 200 of the first variation of the first embodiment has, as illustrated in FIG. 3, a structure where the pitch of the electrode fingers 22a, 22b of the first IDT 20 differs from the pitch of the electrode fingers 42a, 42b of the second IDT 40. Accordingly, the wavelength of the surface acoustic wave propagating through the first IDT 20 differs from the wavelength of the surface acoustic wave propagating through the second IDT 40. Other structures are the same as those in FIG. 1 of the first embodiment, and thus the description is omitted.

Figure 4:
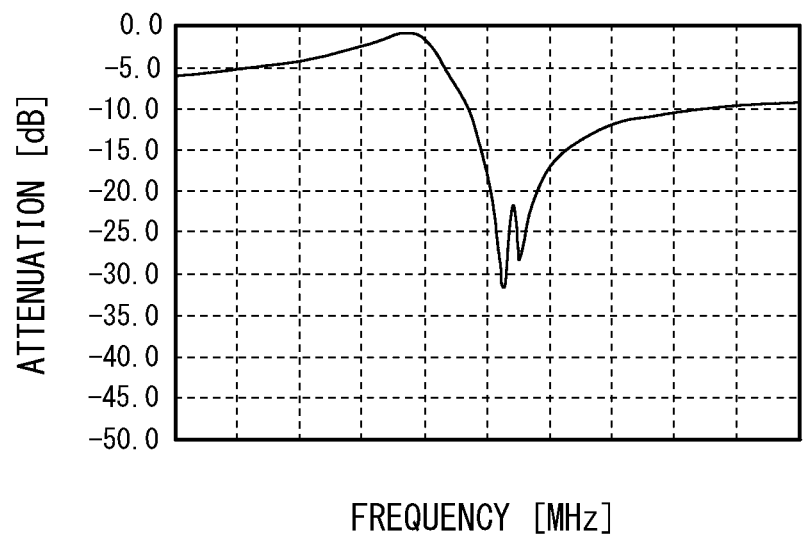
FIG. 4 illustrates simulation results of the frequency characteristic of the SAW device of the first variation of the first embodiment.

Here, a description will be given of a simulation performed on the SAW device 200 of the first variation of the first embodiment. The SAW device 200 used in the simulation includes the first IDT 20, the second IDT 40, and the reflectors 60 that are formed of Al with a thickness of 200 nm on the piezoelectric substrate 10 made of a Y-cut X-propagation lithium tantalate substrate. The pitch of the electrode fingers 22a, 22b of the first IDT 20 is 2.0 μm, and the pitch of the electrode fingers 42a, 42b of the second IDT 40 is 1.99 μm. Additionally, the common bus bar 50 has a width of 2.0 μm. FIG. 4 illustrates simulation results of the frequency characteristic of the SAW device 200 in accordance with the first variation of the first embodiment. FIG. 4 reveals that multiple anti-resonant frequencies are formed when the pitch of the electrode fingers 22a, 22b of the first IDT 20 is made to be differ from the pitch of the electrode fingers 42a, 42b of the second IDT 40.

Figure 5:
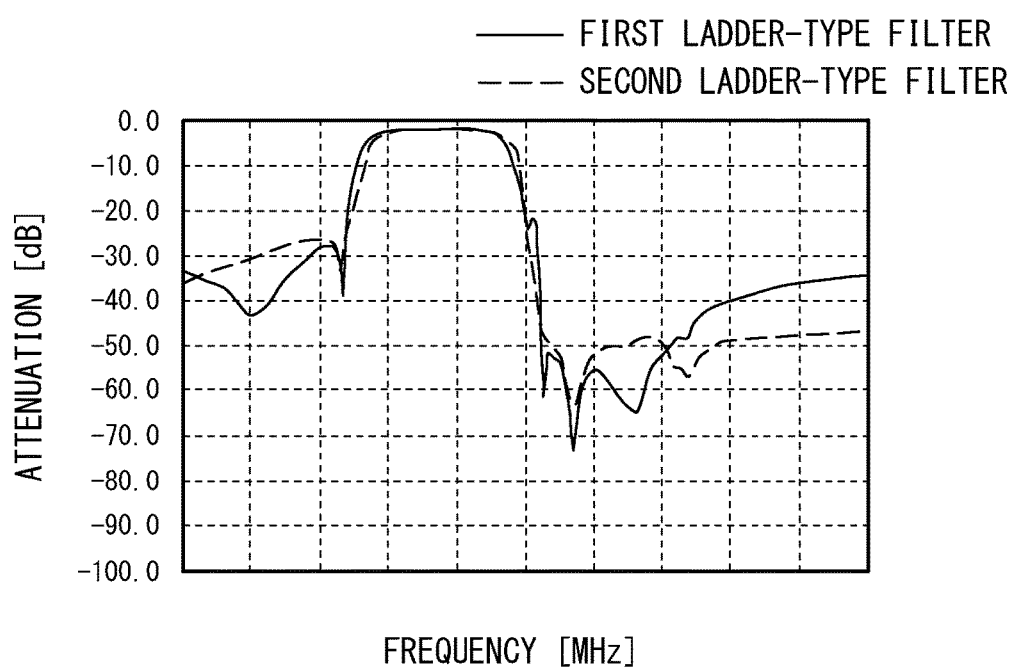
FIG. 5 illustrates simulation results of the pass characteristic of a ladder-type filter using the SAW device in accordance with the first variation of the first embodiment.

FIG. 5 illustrates simulation results of the pass characteristic of a ladder-type filter using the SAW device 200 of the first variation of the first embodiment (hereinafter, referred to as a first ladder-type filter). The first ladder-type filter used in the simulation had the same structure as that of FIG. 12 described later, and used the SAW device 200 of the first variation of the first embodiment for series resonators S1~S4 and a parallel resonator P1. A SAW device of which the IDT is not divided in series was used for parallel resonators P2~P4. For comparison, simulated were the pass characteristic of a ladder-type filter using the SAW device 100 of the first embodiment for the series resonators S1~S4 and the parallel resonator P1 instead of the SAW device 200 of the first variation of the first embodiment (hereinafter, referred to as a second ladder-type filter).

As exhibited in FIG. 4, multiple anti-resonant frequencies are formed in the SAW device 200 of the first variation of the first embodiment, and thus the first ladder-type filter has large attenuation across the wide bandwidth in the suppression range compared to the second ladder-type filter.

As described above, the SAW device 200 of the first variation of the first embodiment has, as illustrated in FIG. 3, a structure where the pitch of the electrode fingers 22a, 22b of the first IDT 20 differs from the pitch of the electrode fingers 42a, 42b of the second IDT 40. Thus, multiple anti-resonant frequencies are formed as exhibited in FIG. 4. Therefore, the application of the SAW device 200 of the first variation of the first embodiment in, for example, a ladder-type filter allows the ladder-type filter to have large attenuation across the wide bandwidth in the suppression range as exhibited in FIG. 5.

Figure 6:
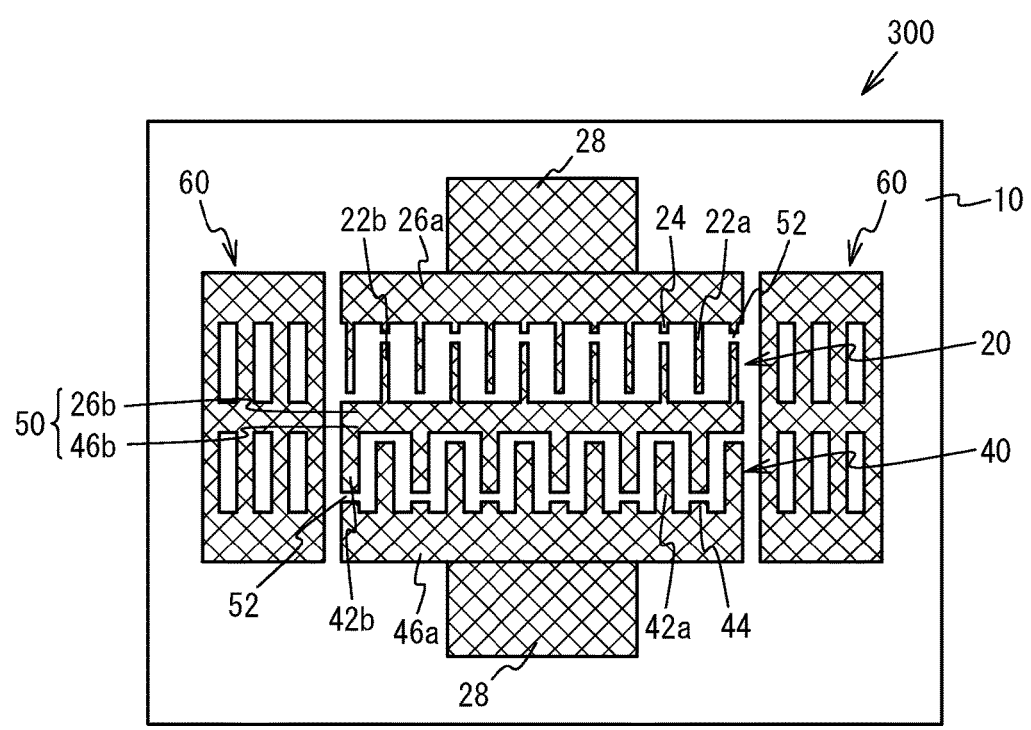
FIG. 6 is a top view of a SAW device in accordance with a second variation of the first embodiment.

FIG. 6 is a top view of a SAW device in accordance with a second variation of the first embodiment. A SAW device 300 of the second variation of the first embodiment has, as illustrated in FIG. 6, a structure where the L/S ratio of the first IDT 20, which is a ratio of the width of the electrode fingers 22a, 22b to the distance between the adjacent electrode fingers 22a, 22b, differs from the L/S ratio of the second IDT 40, which is a ratio of the width of the electrode fingers 42a, 42b to the distance between the adjacent electrode fingers 42a, 42b. Other structures are the same as those in FIG. 1 of the first embodiment, and thus the description is omitted.

When the L/S ratio of the electrode fingers 22a, 22b of the first IDT 20 differs from the L/S ratio of the electrode fingers 42a, 42b of the second IDT 40 as described in the SAW device 300 of the second variation of the first embodiment, multiple anti-resonant frequencies are formed as with in the SAW device 200 of the first variation of the first embodiment. Thus, the application of the SAW device 300 of the second variation of the first embodiment in, for example, a ladder-type filter allows the ladder-type filter to have large attenuation across the wide bandwidth in the suppression range.

Figure 7A:
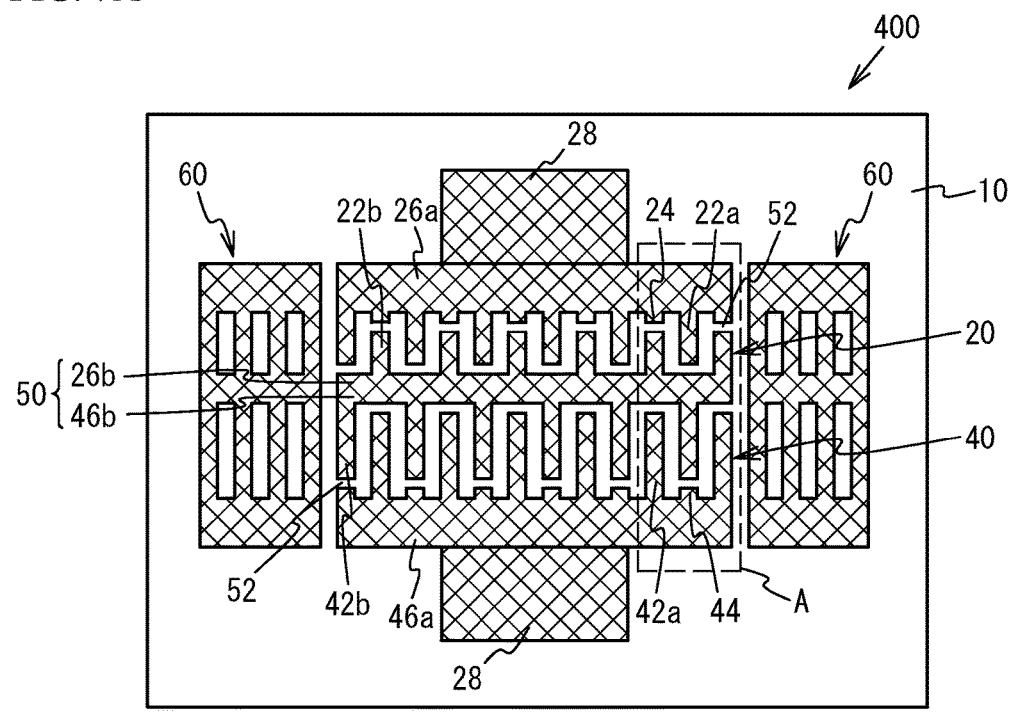
FIG. 7A is a top view of a SAW device in accordance with a third variation of the first embodiment.
Figure 7B:
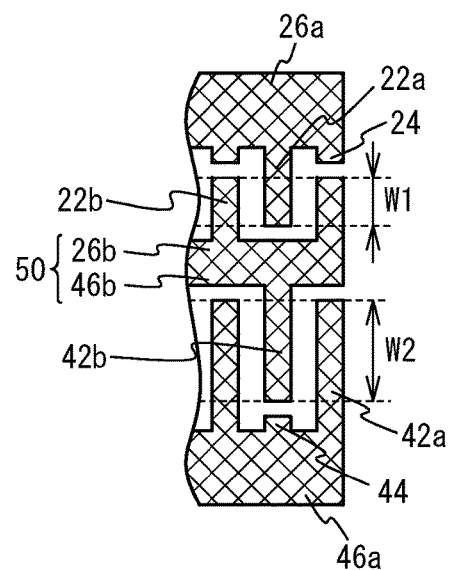
FIG. 7B is an enlarged view of a region A in FIG. 7A.

FIG. 7A is a top view of a SAW device in accordance with a third variation of the first embodiment, and FIG. 7B is an enlarged view of a region A in FIG. 7A. A SAW device 400 of the third variation of the first embodiment has, as illustrated in FIG. 7A and FIG. 7B, a structure where the aperture length W1, which is a width along which the electrode fingers 22a, 22b of the first IDT 20 overlap each other, differs from the aperture length W2, which is a width along which the electrode fingers 42a, 42b of the second IDT 40 overlap each other. Other structures are the same as those in FIG. 1 of the first embodiment, and thus the description is omitted.

When the aperture length W1 of the electrode fingers 22a, 22b of the first IDT 20 differs from the aperture length W2 of the electrode fingers 42a, 42b of the second IDT 40 as described in the SAW device 400 of the third variation of the first embodiment, multiple anti-resonant frequencies are formed as with in the SAW device 200 of the first variation of the first embodiment. Thus, the application of the SAW device 400 of the third variation of the first embodiment in, for example, a ladder-type filter allows the ladder-type filter to have large attenuation across the wide bandwidth in the suppression range.

Figure 8:
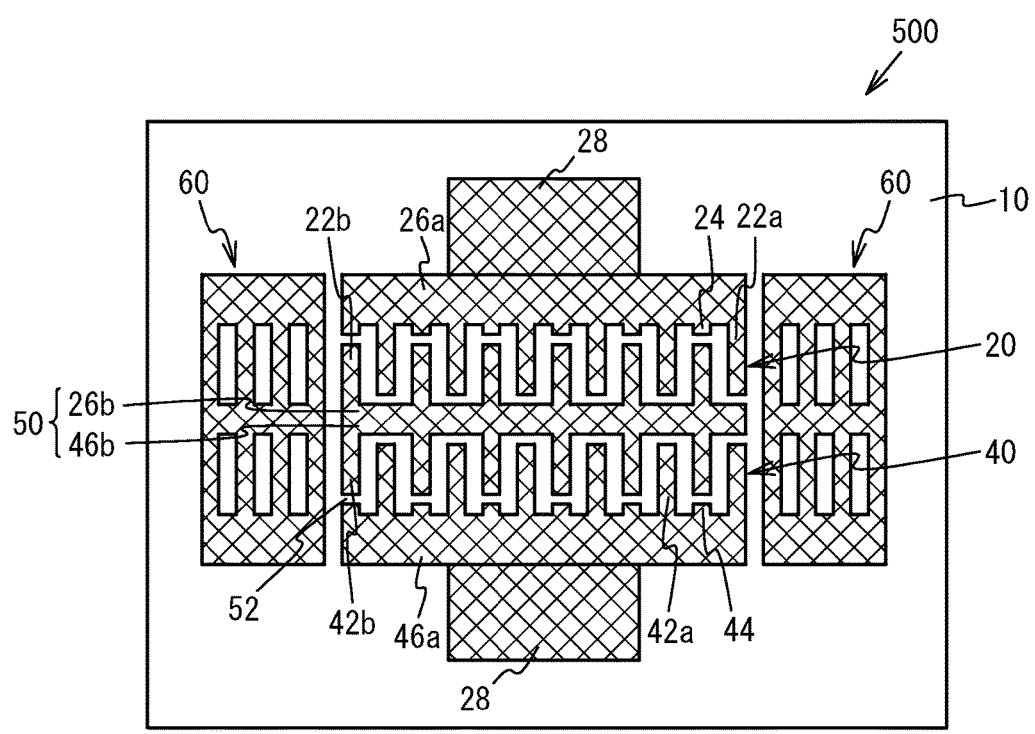
FIG. 8 is a top view of a SAW device in accordance with a fourth variation of the first embodiment.

FIG. 8 is a top view of a SAW device in accordance with a fourth variation of the first embodiment. A SAW device 500 of the fourth variation of the first embodiment has, as illustrated in FIG. 8, a structure where the electrode finger 22a of the first IDT 20 and the electrode finger 42a of the second IDT 40 are located on a straight line in the direction in which the electrode fingers 22a, 42a extend. The electrode finger 22b of the first IDT 20 and the electrode finger 42b of the second IDT 40 are located in a line in the direction in which the electrode fingers 22b, 42b extend. Accordingly, the phase of the surface acoustic wave propagating through the first IDT 20 is the same as the phase of the surface acoustic wave propagating through the second IDT 40. Other structures are the same as those in FIG. 1 of the first embodiment, and thus the description is omitted.

Figure 9A:
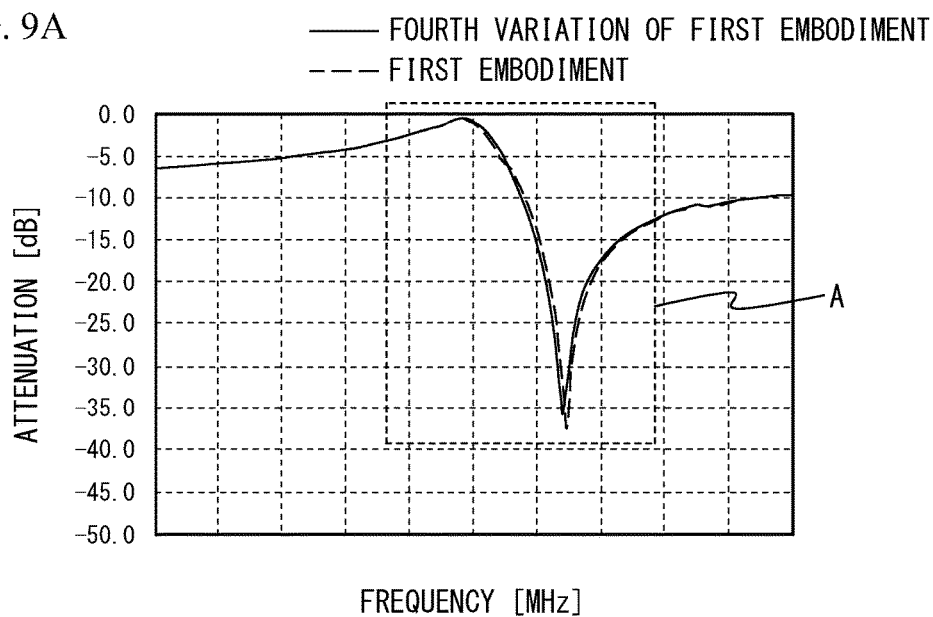
FIG. 9A illustrates measurement results of the frequency characteristic of the SAW device of the fourth variation of the first embodiment.
Figure 9B:
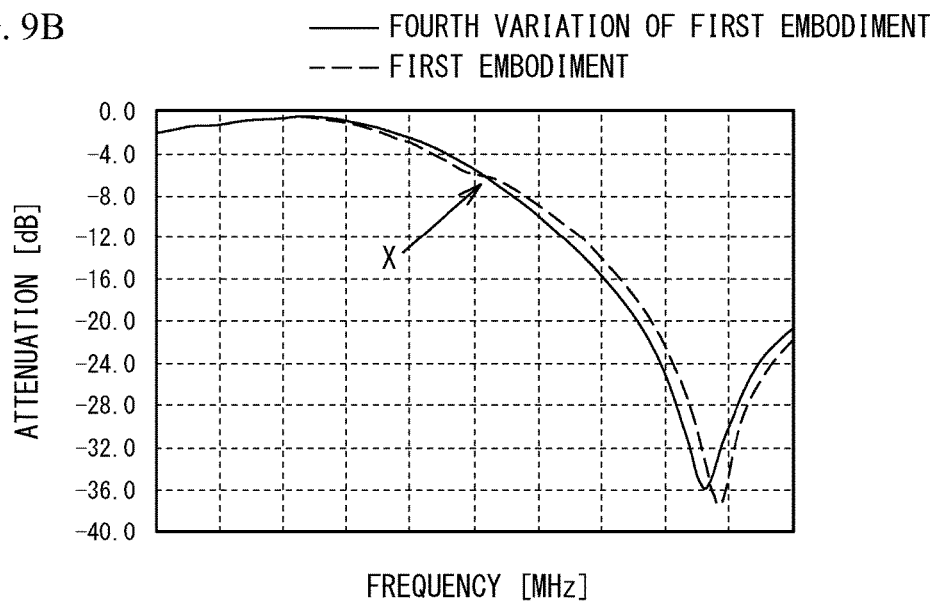
FIG. 9B is an enlarged view of a region A in FIG. 9A.
Figure 10:
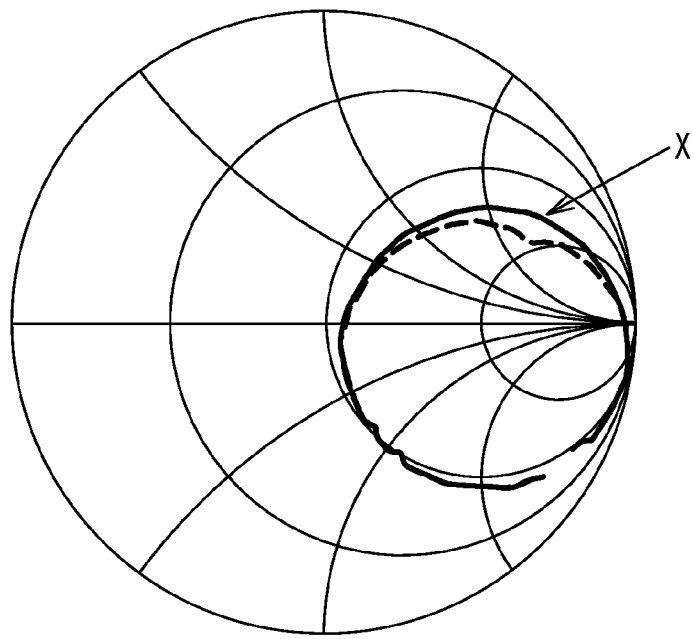
FIG. 10 is a Smith chart of the reflection characteristic of the SAW device of the fourth variation of the first embodiment.

Here, a description will be given of a simulation performed on the SAW device 500 of the fourth variation of the first embodiment. The SAW device 500 used in the simulation includes the first IDT 20, the second IDT 40, and the reflectors 60 that are formed of Al with a thickness of 200 nm on the piezoelectric substrate 10 made of a Y-cut X-propagation lithium tantalate substrate. The pitch of the electrode fingers 22a, 22b of the first IDT 20 and the pitch of the electrode fingers 42a, 42b of the second IDT 40 are 2.0 μm. The common bus bar 50 has a width of 2.0 μm. FIG. 9A illustrates simulation results of the frequency characteristic of the SAW device 500 of the fourth variation of the first embodiment, and FIG. 9B is an enlarged view of a region A of FIG. 9A. FIG. 10 is a Smith chart of the reflection characteristic of the SAW device 500 of the fourth variation of the first embodiment. For comparison, the results of the SAW device 100 of the first embodiment (the case where the surface acoustic wave propagating through the first IDT 20 is out of phase with the surface acoustic wave propagating through the second IDT 40 by approximately 180°) are also illustrated.

As exhibited in FIG. 9A through FIG. 10, in the SAW device 500 of the fourth variation of the first embodiment, the deformation of the waveform (e.g., the part indicated by X in FIG. 9B and FIG. 10) is reduced compared to the SAW device 100 of the first embodiment. The reason is considered as follows. As the surface acoustic wave propagating through the first IDT 20 is out of phase with the surface acoustic wave propagating through the second IDT 40 by approximately 180° in the SAW device 100 of the first embodiment, the deformation of the waveform is caused by the interference by the surface acoustic wave leaking from the first IDT 20 to the second IDT 40 or by the surface acoustic wave leaking from the second IDT 40 to the first IDT 20. In contrast, in the SAW device 500 of the fourth variation of the first embodiment, the phase of the surface acoustic wave propagating through the first IDT 20 is the same as the phase of the surface acoustic wave propagating through the second IDT 40, and thus the deformation of the waveform caused by the interference of the surface acoustic wave is reduced even when the surface acoustic wave leaks from the first IDT 20 to the second IDT 40 or from the second IDT 40 to the first IDT 20.

As described above, in the SAW device 500 of the fourth variation of the first embodiment, the phase of the surface acoustic wave propagating through the first IDT 20 is the same as the phase of the surface acoustic wave propagating through the second IDT 40. Thus, the deterioration of the characteristics caused by the leakage of the surface acoustic wave from the first IDT 20 to the second IDT 40 or from the second IDT 40 to the first IDT 20 is reduced.

In the SAW device 500 of the fourth variation of the first embodiment, the case where the phase of the surface acoustic wave propagating through the first IDT 20 is the same as the phase of the surface acoustic wave propagating through the second IDT 40 is not limited to the case where the phases are completely the same, but includes a case where the phases are the same to the extent that the deterioration of the characteristics is reduced. Therefore, the electrode finger 22a of the first IDT 20 and the electrode finger 42a of the second IDT 40 may not be located completely on a straight line in the direction in which the electrode fingers 22a, 42a extend, and may be located with having some minor deviations in the width direction of the electrode fingers 22a, 42a. This is applicable to the electrode finger 22b of the first IDT 20 and the electrode finger 42b of the second IDT 40.

Second Embodiment

Figure 11:
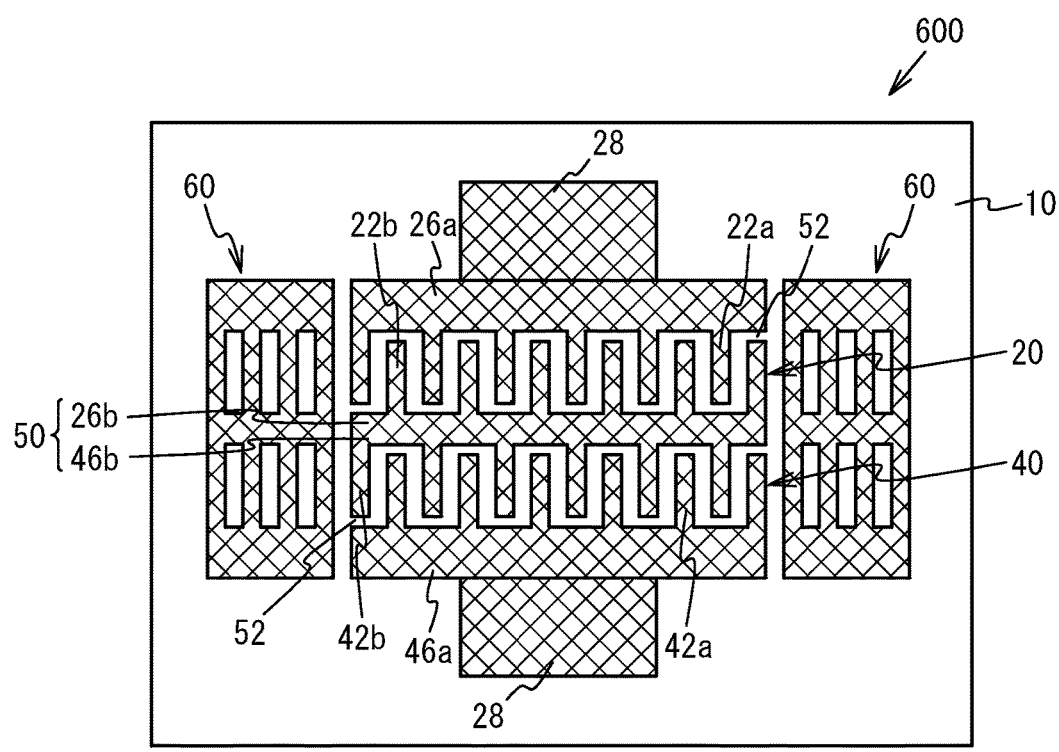
FIG. 11 is a top view of a SAW device in accordance with a second embodiment.

FIG. 11 is a top view of a SAW device in accordance with a second embodiment. A SAW device 600 of the second embodiment has, as illustrated in FIG. 11, a structure where the dummy electrode fingers 24, 44 are not provided, the electrode finger 22b connected to the common bus bar 50 is located so that the tip of the electrode finger 22b faces the bus bar 26a across the gap 52, and the electrode finger 42b connected to the common bus bar 50 is located so that the tip of the electrode finger 42b faces the bus bar 46a across the gap 52. Other structures are the same as those in FIG. 1 of the first embodiment, and thus the description is omitted.

As described in the SAW device 600 of the second embodiment, the bus bar 26a, which is not the common bus bar 50, of the two bus bars of the first IDT 20 may connect to no dummy electrode finger facing the tip of the electrode finger 22b connected to the common bus bar 50 across the gap 52, and the bus bar 46a, which is not the common bus bar 50, of the two bus bars of the second IDT 40 may connect to no dummy electrode finger facing the tip of the electrode finger 42b connected to the common bus bar 50 across the gap 52. Even in this case, the power durability is improved and the device is reduced in size while the deterioration of characteristics is reduced.

In the second embodiment, as with in the first variation of the first embodiment, the pitch of the electrode fingers 22a, 22b of the first IDT 20 may differ from the pitch of the electrode fingers 42a, 42b of the second IDT 40. As with in the second variation of the first embodiment, the L/S ratio of the electrode fingers 22a, 22b of the first IDT 20 may differ from the L/S ratio of the electrode fingers 42a, 42b of the second IDT 40. As with in the third variation of the first embodiment, the aperture length of the electrode fingers 22a, 22b of the first IDT 20 may differ from the aperture length of the electrode fingers 42a, 42b of the second IDT 40. As with in the fourth variation of the first embodiment, the phase of the surface acoustic wave propagating through the first IDT 20 may be the same as the phase of the surface acoustic wave propagating through the second IDT 40.

The first embodiment through the second embodiment describe the case where the first IDT 20 and the second IDT 40 are connected in series, i.e., the case where two IDTs are connected in series, as an example, but three or more IDTs may be connected in series.

Third Embodiment

Figure 12:
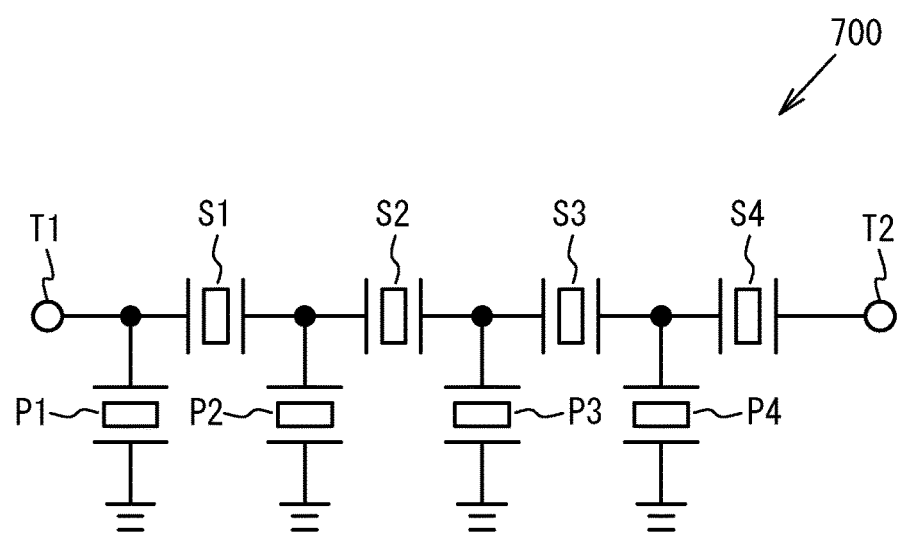
FIG. 12 illustrates a filter in accordance with a third embodiment.

A third embodiment uses at least one of the SAW devices described in the first embodiment through the second embodiment in a filter. FIG. 12 is a filter in accordance with the third embodiment. A filter 700 of the third embodiment is a ladder-type filter including, as illustrated in FIG. 12, one or more series resonators S1~S4 connected in series between input/output terminals T1 and T2, and one or more parallel resonators P1~P4 connected in parallel. At least one of the series resonators S1~S4 and the parallel resonators P1~P4 can be any one of the SAW devices described in the first embodiment through the second embodiment.

Here, a description will be given of the pass characteristic of the filter 700, which is fabricated by using the piezoelectric substrate 10 made of a 44° Y-cut X-propagation lithium tantalate (LT) substrate, of the third embodiment. The filter 700 of the third embodiment of which the pass characteristic was measured used the SAW device 200 of the first variation of the first embodiment for the series resonators S1~S4 and the parallel resonator P1, and used a SAW device of which the IDT is not divided in series for the parallel resonators P2~P4.

Figure 13A:
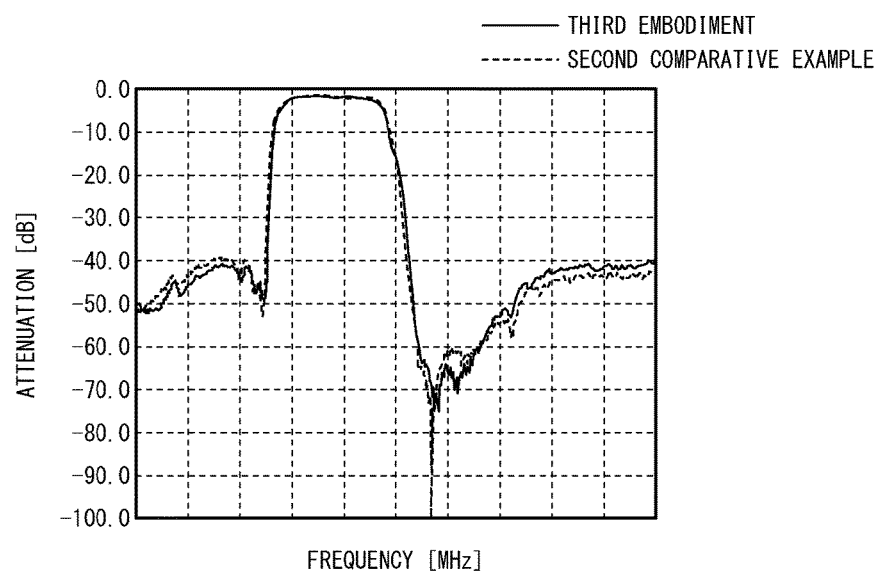
FIG. 13A is a diagram illustrating the pass characteristic of the filter of the third embodiment (No. 1)
Figure 13B:
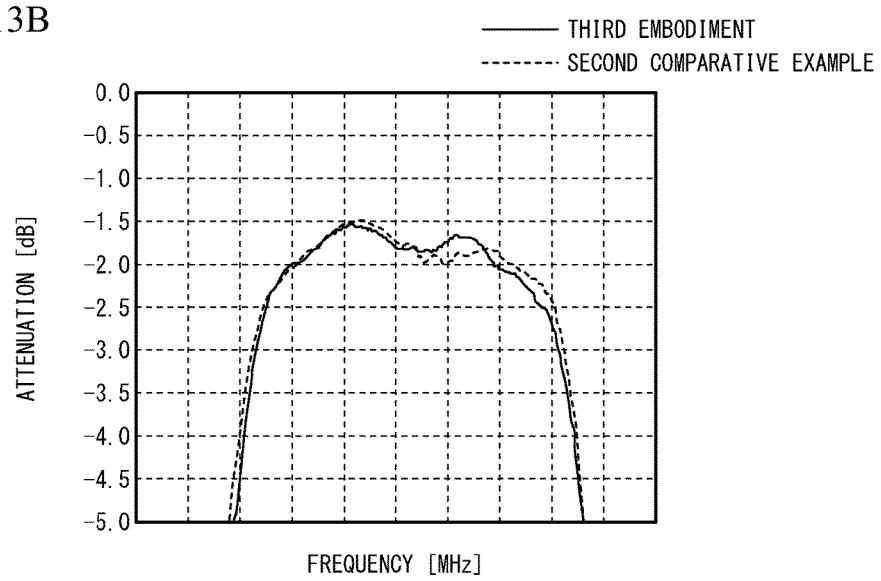
FIG. 13B is an enlarged view of the passband of FIG. 13A.

FIG. 13A is a diagram illustrating the pass characteristic of the filter 700 of the third embodiment, and FIG. 13B is an enlarged view of the pass band of FIG. 13A. For comparison, the pass characteristic of a filter of a second comparative example is also illustrated. The filter of the second comparative example differs from the filter 700 of the third embodiment of which the pass characteristic was measured in that the SAW device of the first comparative example was used for the series resonators S1~S4 and the parallel resonator P1. As exhibited in FIG. 13A and FIG. 13B, the filter 700 of the third embodiment and the filter of the second comparative example have almost the same loss in the passband, and thus have similar characteristics.

A description will next be given of the pass characteristic of the filter 700 of the third embodiment in the case where the piezoelectric substrate 10 was made of a 42° Y-cut X-propagation lithium tantalate (LT) substrate and in the case where the piezoelectric substrate 10 was made of a 44° Y-cut X-propagation lithium tantalate (LT) substrate. The filter 700 of the third embodiment of which the pass characteristic was measured used the SAW device 200 of the first variation of the first embodiment for the series resonators S1~S4 and the parallel resonator P1, and used a SAW device of which the IDT is not divided in series for the parallel resonators P2~P4.

Figure 14A:
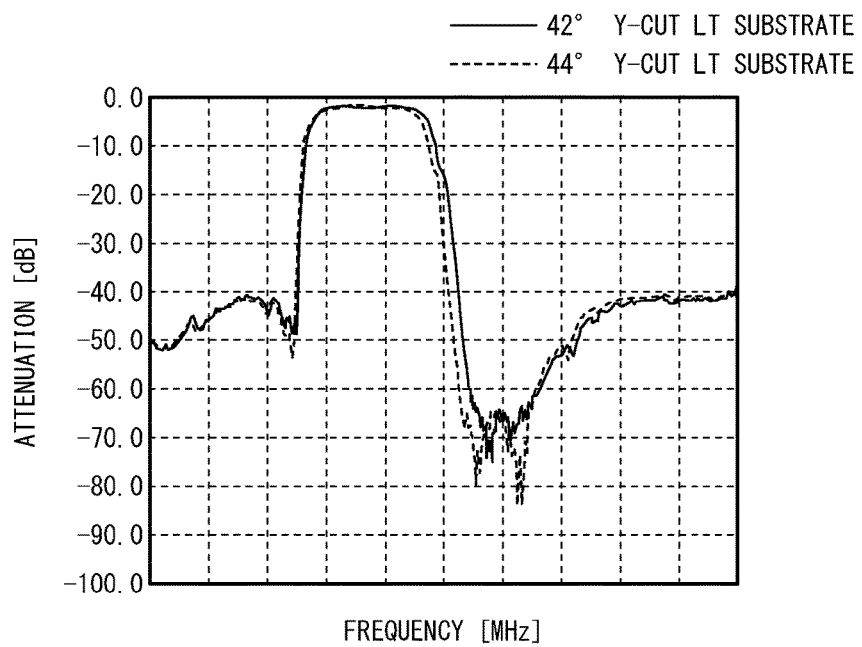
FIG. 14A is a diagram illustrating the pass characteristic of the filter of the third embodiment (No. 2)
Figure 14B:
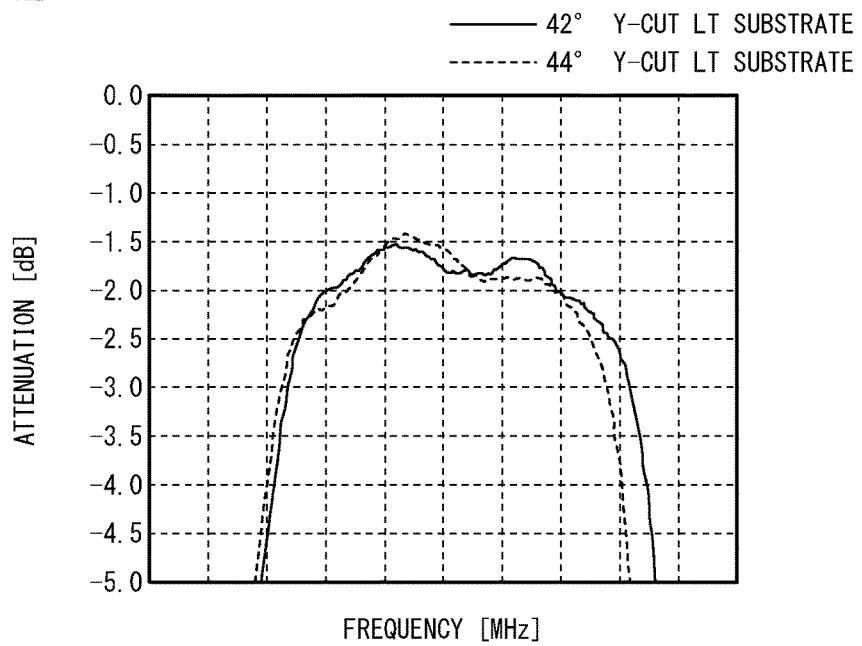
FIG. 14B is an enlarged view of the passband of FIG. 14A.

FIG. 14A is a diagram illustrating the pass characteristic of the filter 700 in accordance with the third embodiment, and FIG. 14A is an enlarged view of the pass band of FIG. 14B. As exhibited in FIG. 14A and FIG. 14B, even when the substrate orientation (cut angle) of the lithium tantalate substrate is changed, the similar characteristics can be obtained.

In FIG. 13A through FIG. 14B, the SAW device 200 of the first variation of the first embodiment is used for at least one of the series resonators S1~S4 and the parallel resonators P1~P4, but the same effect is obtained when any one of the SAW devices described in the first embodiment through the second embodiment is used.

The above results reveal that the use of any one of the SAW devices described in the first embodiment through the second embodiment for at least one of the series resonators S1~S4 and the parallel resonators P1~P4 allows the filter to be reduced in size without deteriorating the characteristics (e.g., without increasing the loss in the passband). Additionally, when the piezoelectric substrate 10 is made of a Y-cut X-propagation lithium tantalate substrate, the similar characteristics can be obtained regardless of the substrate orientation (cut angle). For example, a 38°~48° Y-cut X-propagation lithium tantalate substrate can be used.

Figure 15:
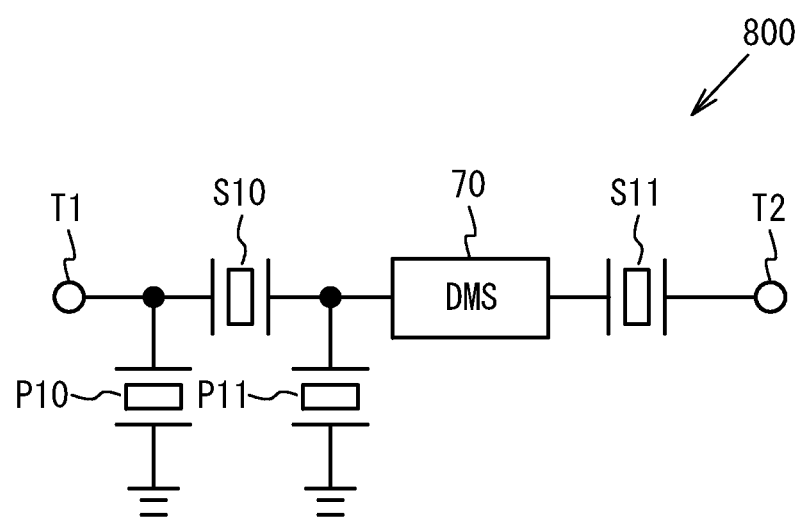
FIG. 15 illustrates a filter in accordance with a first variation of the third embodiment.

FIG. 15 illustrates a filter in accordance with a first variation of the third embodiment. A filter 800 of the first variation of the third embodiment includes, as illustrated in FIG. 15, a series resonator S10 connected in series between a double-mode filter (DMS) 70 and the input/output terminal T1, and parallel resonators P10, P11 connected in parallel. A series resonator S11 is connected in series between the double mode filter 70 and the input/output terminal T2. At least one of the series resonators S10, S11 and the parallel resonators P10, P11 can be any one of the SAW devices described in the first embodiment through the second embodiment.

The third embodiment describes a ladder-type filter, and the first variation of the third embodiment describes a filter in which the SAW device is connected to an input/output of the double mode filter 70 as an example, but do not intend to suggest any limitation. The SAW device described in the first embodiment through the second embodiment may be used in other filters such as a lattice-type filter.

Fourth Embodiment

Figure 16:
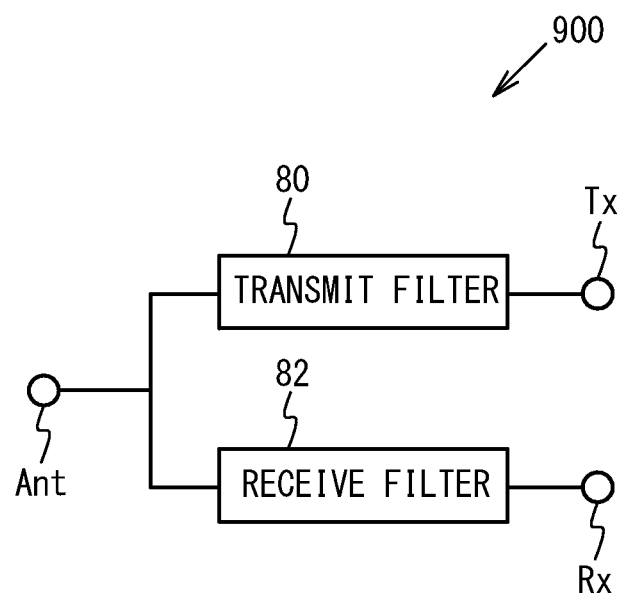
FIG. 16 illustrates a duplexer in accordance with a fourth embodiment.

A fourth embodiment uses the filter described in the third embodiment in a duplexer. FIG. 16 illustrates a duplexer in accordance with the fourth embodiment. A duplexer 900 of the fourth embodiment includes, as illustrated in FIG. 16, a transmit filter 80 connected between an antenna terminal Ant and a transmit terminal Tx and a receive filter 82 connected between an antenna terminal Ant and a receive terminal Rx. The passband of the transmit filter 80 differs from the passband of the receive filter 82. The transmit filter 80 passes signals in the transmit band to the antenna terminal Ant as transmission signals among signals input from the transmit terminal Tx, and suppresses signals in other bands. The receive filter 82 passes signals in the receive band to the receive terminal Rx as reception signals among signals input from the antenna terminal Ant, and suppresses signals in other bands. At least one of the transmit filter 80 and the receive filter 82 can be the filter described in the third embodiment.

Although the embodiments of the present invention have been described in detail, it is to be understood that the various change, substitutions, and alterations could be made hereto without departing from the spirit and scope of the invention.

What is claimed is:
1. Acoustic wave device comprising:
a piezoelectric substrate;
a first Interdigital Transducer (IDT) located on the piezoelectric substrate and including electrode fingers and two bus bars; and a second IDT located on the piezoelectric substrate, including electrode fingers and two bus bars, and connected in series to the first IDT, wherein the first IDT and the second IDT share a single common bus bar as a first bus bar of the two bus bars of the first IDT and a first bus bar of the two bus bars of the second IDT, the common bus bar has a width that is not more than two times and more than 0.3 times a wavelength of an acoustic wave propagating through the first IDT and the second IDT, the common bus bar connects to no dummy electrode finger facing a tip of the electrode finger connected to a second bus bar of the two bus bars of the first IDT across a gap and no dummy electrode finger facing a tip of the electrode finger connected to a second bus bar of the two bus bars of the second IDT across a gap, the second bus bar of the two bus bars of the first IDT connects to a dummy electrode finger located to face a tip of the electrode finger connected to the common bus bar across a gap, and the second bus bar of the two bus bars of the second IDT connects to a dummy electrode finger located to face a tip of the electrode finger connected to the common bus bar across a gap, and a line and space ratio of the electrode fingers included in the first IDT differs from a line and space ratio of the electrode fingers included in the second IDT.

2. The acoustic wave device according to claim 1, wherein the width of the common bus bar is not more than 1.2 times and more than 0.3 times the wavelength of the acoustic wave propagating through the first IDT and the second IDT.

3. The acoustic wave device according to claim 1, wherein the width of the common bus bar is not more than 1.2 times and more than 0.5 times the wavelength of the acoustic wave propagating through the first IDT and the second IDT.

4. The acoustic wave device according to claim 1, wherein a pitch of the electrode fingers included in the first IDT differs from a pitch of the electrode fingers included in the second IDT.

5. The acoustic wave device according to claim 4, wherein the acoustic wave device has a multiple anti-resonant frequencies.

6. The acoustic wave device according to claim 1, wherein an aperture length of the electrode fingers included in the first IDT differs from an aperture length of the electrode fingers included in the second IDT.

7. The acoustic wave device according to claim 1, wherein a phase of an acoustic wave propagating through the first IDT is the same as a phase of an acoustic wave propagating through the second IDT.

8. A filter comprising:
the acoustic wave device according to claim 1.

9. A duplexer comprising:
the filter according to claim 8.

10. The acoustic wave device according to claim 1, wherein
the second bus bar of the two bus bars of the first IDT connects to an input terminal for inputting a signal to the first IDT, and the second bus bar of the two bus bars of the second IDT connects to an output terminal for outputting the signal from the second IDT.

11. Acoustic wave device comprising:
a piezoelectric substrate;
a first Interdigital Transducer (IDT) located on the piezoelectric substrate and including electrode fingers and two bus bars,
a second IDT located on the piezoelectric substrate, including electrode fingers and two bus bars, and connected in series to the first IDT; and
a pair of reflectors that sandwiches only the first IDT and the second IDT, wherein
the first IDT and the second IDT share a single common bus bar as a first bus bar of the two bus bars of the first IDT and a first bus bar of the two bus bars of the second IDT,
the common bus bar has a width that is not more than two times and more than 0.3 times a wavelength of an acoustic wave propagating through the first IDT and the second IDT, and is a floating electrode,
the common bus bar connects to no dummy electrode finger facing a tip of the electrode finger connected to a second bus bar of the two bus bars of the first IDT across a gap and no dummy electrode finger facing a tip of the electrode finger connected to a second bus bar of the two bus bars of the second IDT across a gap, and
a line and space ratio of the electrode fingers included in the first IDT differs from a line and space ratio of the electrode fingers included in the second IDT.

12. The acoustic wave device according to claim 11, wherein
the pair of reflectors does not sandwich any other structures other than the first IDT and the second IDT.

13. A ladder-type filter comprising series resonators and parallel resonators, at least one of the series resonators and the parallel resonators including:
a first Interdigital Transducer (IDT) including electrode fingers and two bus bars connected to the electrode fingers of the first IDT; and
a second IDT including electrode fingers and two bus bars connected to the electrode fingers of the second IDT, and connected in series to the first IDT, wherein
the first IDT and the second IDT share a single common bus bar as a first bus bar of the two bus bars of the first IDT and a first bus bar of the two bus bars of the second IDT,
the common bus bar has a width that is not more than two times a wavelength of an acoustic wave propagating through the first IDT and the second IDT,
the common bus bar connects to no dummy electrode finger facing a tip of the electrode finger connected to a second bus bar of the two bus bars of the first IDT across a gap and no dummy electrode finger facing a tip of the electrode finger connected to a second bus bar of the two bus bars of the second IDT across a gap, and
a line and space ratio of the electrode fingers included in the first IDT differs from a line and space ratio of the electrode fingers included in the second IDT.

14. The acoustic wave device according to claim 13, wherein
the common bus bar is a floating electrode.

* * * * *